United States Patent
Ochi et al.

(10) Patent No.: US 7,228,248 B2
(45) Date of Patent: Jun. 5, 2007

(54) TEST APPARATUS, TIMING GENERATOR AND PROGRAM THEREFOR

(75) Inventors: Takashi Ochi, Tokyo (JP); Noriaki Chiba, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 11/222,681

(22) Filed: Sep. 9, 2005

(65) Prior Publication Data

US 2007/0061094 A1   Mar. 15, 2007

(51) Int. Cl.
*G06F 19/00* (2006.01)
(52) U.S. Cl. ............... 702/108; 702/108; 702/117; 702/182; 324/500; 324/537; 324/538; 324/771; 73/1.42; 714/736; 340/146.2
(58) Field of Classification Search ............ 702/108, 702/117, 182; 324/500, 537, 538, 771; 73/1.42; 714/736; 340/146.2
See application file for complete search history.

(56) References Cited

U.S. PATENT DOCUMENTS

| | | | |
|---|---|---|---|
| 5,231,314 A | * | 7/1993 | Andrews .................... 327/153 |
| 5,659,553 A | * | 8/1997 | Suzuki ........................ 714/736 |
| 6,011,732 A | * | 1/2000 | Harrison et al. ............ 365/194 |
| 2004/0122620 A1 | * | 6/2004 | Doi et al. .................... 702/182 |

OTHER PUBLICATIONS

Jayabalan et al., 'PLL Based Based High Speed Functional Testing', 2003, IEEE Publication, ATS'03, pp. 1-4.*
Arai, 'A High-Resolution Time Digitizer Utilizing Dual PLL Circuits', 2004, IEEE Publication, pp. 969-973.*

* cited by examiner

*Primary Examiner*—Edward Raymond
*Assistant Examiner*—Elias Desta
(74) *Attorney, Agent, or Firm*—Osha·Liang LLP

(57) ABSTRACT

There is provided a test apparatus including a PLL circuit for generating a strobe signal of which the timing is shifted according to a given delay control voltage, a variable delay circuit being provided divergently from a path connecting the PLL circuit and the timing comparator and delaying the strobe signal according to the predetermined phase difference of the strobe signal for the output signal, and a first phase comparing unit for comparing a phase of the strobe signal output from the variable delay circuit and a phase of the output signal output from the device under test and supplying the delay control voltage according to the phase difference to the PLL circuit.

9 Claims, 6 Drawing Sheets

TEST APPARATUS, TIMING GENERATOR AND PROGRAM THEREFOR

BACKGROUND OF THE INVENTION

1. Field of the Invention

The present invention relates to a test apparatus testing a device under test such as a semiconductor circuit, a timing generator provided in the test apparatus, and a program making the test apparatus function.

2. Description of Related Art

When conventionally testing a device under test, there has been a method of inputting a test signal into the device under test and comparing an output signal output from the device under test with an expectation pattern in order to decide the good or bad of the device under test. In this case, the output signal output from the device under test is sampled by means of a strobe signal with a desired phase, and then a sampled result is compared with the expectation pattern. Moreover, in order to measure a waveform of an output signal output from the device under test, there has been a method of sampling the output signal by means of a strobe signal of which a phase for the output signal is changed by degrees.

In this manner, when testing a device under test, it is necessary to generate a strobe signal having a desired phase difference for an output signal output from the device under test. Conventionally, as an apparatus for generating a strobe signal with a desired phase, there has been known a circuit that delays a clock signal by means of a plurality of delay paths having a delay amount different from one another and selects a clock having a desired delay amount among the delay clocks delayed by each delay path to output the selected clock.

Now, since a related patent document is not recognized, the description is omitted.

However, a conventional apparatus has a problem that a circuit scale is large. For this reason, there is expected an apparatus that can generate a strobe signal having a desired phase difference for an output signal by means of a simple circuit configuration.

SUMMARY OF THE INVENTION

Therefore, one or more embodiments of the present invention provide a test apparatus, a timing generator, and a program that can solve the foregoing problems. The above and other objects can be achieved by one or more embodiments. The claims define advantageous and exemplary combinations of the present invention.

To solve this object, according to the first aspect of the present invention, there is provided a test apparatus testing a device under test. The test apparatus includes: a timing generator for generating, based on an output signal from the device under test, a strobe signal having a predetermined phase difference for the output signal; a timing comparator for detecting a signal value of the output signal at the timing of the strobe signal; and a decider for comparing the signal value detected by said timing comparator with a previously given expected value and deciding the good or bad of the device under test, in which the timing generator includes: a PLL circuit for generating the strobe signal of which the timing is shifted according to a given delay control voltage; a variable delay circuit for delaying the strobe signal according to the predetermined phase difference of the strobe signal for the output signal, the variable delay circuit being provided divergently from a path connecting the PLL circuit and said timing comparator; and a first phase comparing unit for comparing a phase of the strobe signal output from the variable delay circuit and a phase of the output signal output from the device under test and supplying the delay control voltage according to the phase difference to the PLL circuit.

The test apparatus may further include a delay controlling unit for previously storing a skew adjustment delay amount of adjusting a skew between a delay amount on a path from the device under test to said timing comparator and a delay amount on a path from the device under test to the first phase comparing unit and controlling a delay amount in the variable delay circuit to be a delay amount obtained by adding and subtracting the predetermined phase difference to and from the skew adjustment delay amount.

The delay controlling unit may control the variable delay circuit to be the delay amount obtained by subtracting the predetermined phase difference from the skew adjustment delay amount when generating the strobe signal that is delayed from the phase of the output signal by the predetermined phase difference, and control the variable delay circuit to be the delay amount obtained by adding the predetermined phase difference to the skew adjustment delay amount when generating the strobe signal that is advanced from the phase of the output signal by the predetermined phase difference.

The variable delay circuit may change the delay amount delaying the strobe signal with a change amount smaller than a data period of the output signal in incremental steps when the phase difference for the output signal generates the strobe signal larger than the data period of the output signal.

The timing generator may further include: a voltage superimposing unit for superimposing a voltage according to a component of integral multiple of the data period in the phase difference on the delay control voltage supplied from the first phase comparing unit to the PLL circuit when the phase difference for the output signal generates the strobe signal larger than the data period of the output signal; and a delay controlling unit for controlling a delay amount of the variable delay circuit with a delay amount according to a component obtained by subtracting the component of integral multiple of the data period from the predetermined phase difference.

The timing generator may further include a voltage superimposing unit for superimposing a phase difference voltage according to the predetermined phase difference on the delay control voltage, and the variable delay circuit may delay the strobe signal so as to cancel a delay caused by the phase difference voltage on the strobe signal.

The PLL circuit may include: a second phase comparing unit for comparing a phase of a given reference clock and the phase of the strobe signal and outputting a PLL control voltage according to the phase difference; a voltage-controlled oscillating unit for generating the strobe signal with frequency according to a given voltage; and an addition unit for adding the delay control voltage and the PLL control voltage to supply the added voltage to the voltage-controlled oscillating unit.

According to the second aspect of the present invention, there is provided a timing generator that generates a strobe signal having a predetermined phase difference for an output signal from a device under test based on the output signal from the device under test. The timing generator includes: a PLL circuit for generating the strobe signal of which the timing is shifted according to a given delay control voltage; a variable delay circuit for delaying the strobe signal according to the predetermined phase difference of the strobe signal for the output signal; and a first phase comparing unit for comparing a phase of the strobe signal output from said variable delay circuit and a phase of the output signal output from the device under test and supplying the delay control voltage according to the phase difference to said PLL circuit.

According to the third aspect of the present invention, there is provided a program making a test apparatus testing a device under test function. The program makes the test apparatus function as: a timing generator for generating, based on an output signal from the device under test, a strobe signal having a predetermined phase difference for the output signal; a timing comparator for detecting a signal value of the output signal at the timing of the strobe signal; and a decider for comparing the signal value detected by said timing comparator with a previously given expected value and deciding the good or bad of the device under test, in which the program makes the timing generator function as: a PLL circuit for generating the strobe signal of which the timing is shifted according to a given delay control voltage; a variable delay circuit for delaying the strobe signal according to the predetermined phase difference of the strobe signal for the output signal, the variable delay circuit being provided divergently from a path connecting the PLL circuit and said timing comparator; and a first phase comparing unit for comparing a phase of the strobe signal output from the variable delay circuit and a phase of the output signal output from the device under test and supplying the delay control voltage according to the phase difference to the PLL circuit.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
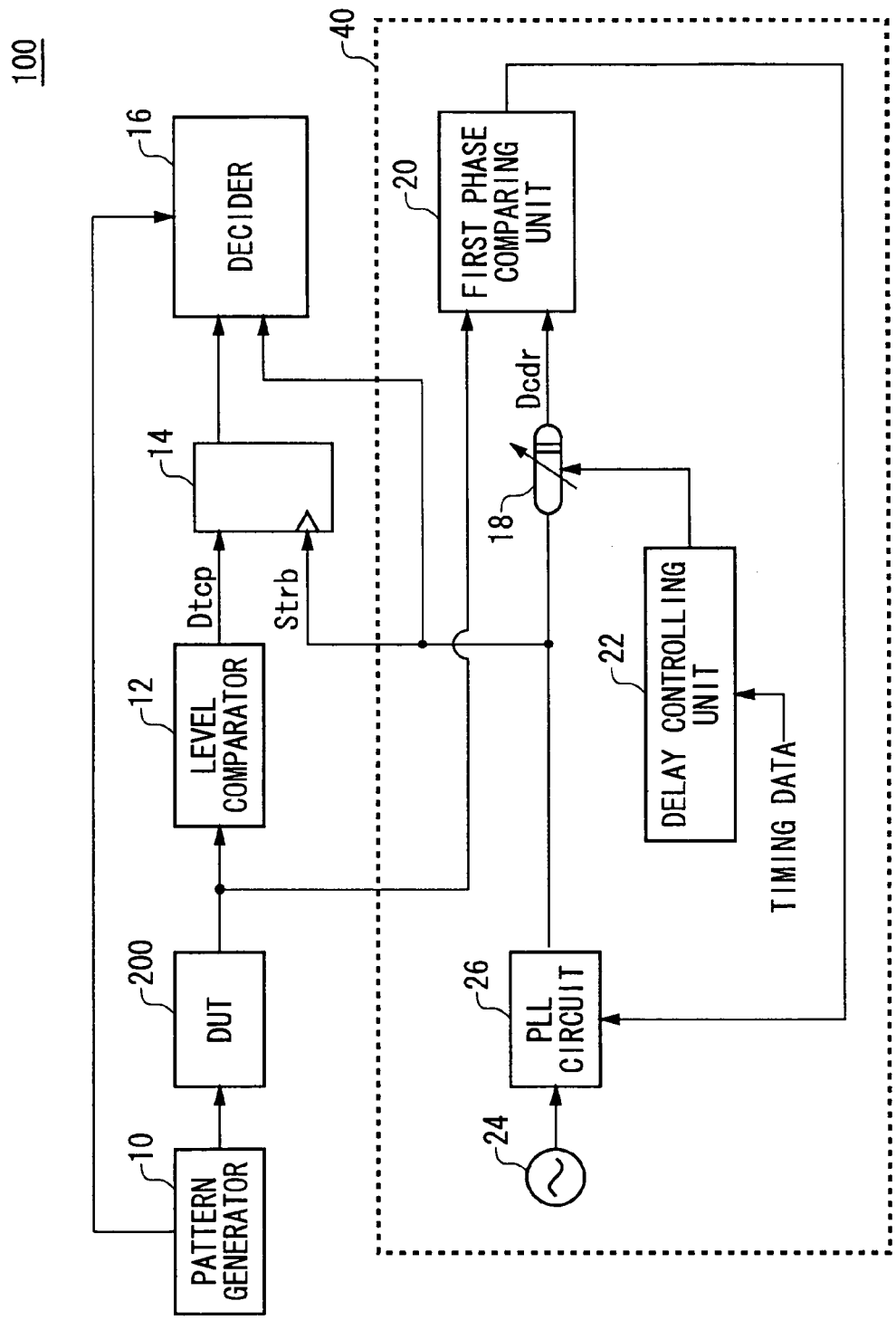
FIG. 1 is a view exemplary showing a configuration of a test apparatus according to an embodiment of the present invention.

FIG. 1 is a view exemplary showing a configuration of a test apparatus 100 according to an embodiment of the present invention. The test apparatus 100 is an apparatus that tests a device under test 200 such as a semiconductor circuit, and includes a pattern generator 10, a level comparator 12, a timing comparator 14, a decider 16, and a timing generator 40.

The pattern generator 10 inputs a test signal testing the device under test 200 into the device under test 200. The level comparator 12 compares a voltage value of an output signal output from the device under test 200 with a predetermined threshold voltage, and converts the output signal into a digital signal.

The timing comparator 14 detects a signal value of the output signal at the timing of a given strobe signal. For example, the timing comparator 14 is a flip-flop that receives a strobe signal through a clock terminal and receives the digital signal output from the level comparator 12 through a signal terminal. The timing comparator 14 acquires and outputs the digital signal, e.g., according to a rising edge of the strobe signal.

The decider 16 compares the signal value detected by the timing comparator 14 and a previously given expected value, and decides the good or bad of the device under test 200. For example, the decider 16 decides the good or bad of the device under test 200 by comparing the expectation pattern generated from the pattern generator 10 and the signal value output from the timing comparator 14.

The timing generator 40 generates a strobe signal having a predetermined phase difference for the output signal based on the output signal from the device under test 200. For example, the timing generator 40 is supplied with timing data indicative of the predetermined phase difference, and generates a strobe signal based on the timing data. In this example, the timing generator 40 has a reference clock generating unit 24, a PLL circuit 26, a variable delay circuit 18, a first phase comparing unit 20, and a delay controlling unit 22.

The reference clock generating unit 24 generates a reference clock with a predetermined period. For example, the reference clock generating unit 24 generates a reference clock having the generally same period as that of the output signal output from the device under test 200.

The PLL circuit 26 receives the reference clock and generates a strobe signal based on the reference clock. A configuration of the PLL circuit 26 will be described below with reference to FIG. 6. Moreover, the PLL circuit 26 shifts the timing of the strobe signal according to a given delay control voltage. For example, the PLL circuit 26 has a voltage-controlled oscillating unit for generating a strobe signal, and changes a voltage to be supplied to the voltage-controlled oscillating unit according to the delay control voltage to shift the timing of the strobe signal.

The variable delay circuit 18 is provided divergently from a path connecting the PLL circuit 26 and the timing comparator 14. The path connecting the PLL circuit 26 and the timing comparator 14 is a path transmitting the strobe signal generated from the PLL circuit 26 to the timing comparator 14. For this reason, the strobe signal output from the PLL circuit 26 is transmitted to the variable delay circuit 18.

In the variable delay circuit 18 is set a delay amount of adjusting a skew between a first delay amount on a path from the device under test 200 to the timing comparator 14 and a second delay amount on a path from the device under test 200 to the first phase comparing unit 20, as a setting value of the delay amount. In this example, a skew adjustment delay amount obtained by subtracting the first delay amount from the second delay amount is set in the variable delay circuit 18.

Then, the variable delay circuit 18 delays the received strobe signal according to a predetermined phase difference of a strobe signal input into the timing comparator 14 for the output signal. The delay controlling unit 22 sets a delay amount by the variable delay circuit 18. The delay controlling unit 22 is supplied with the skew adjustment delay amount and the timing data indicative of the predetermined phase difference, and previously stores these data.

For example, when a strobe signal that is delayed by the predetermined phase difference for the phase of the output signal is generated and input into the timing comparator 14, the delay controlling unit 22 controls the variable delay circuit 18 with a delay amount obtained by subtracting a predetermined phase difference from the skew adjustment delay amount. Moreover, when a strobe signal that is advanced by the predetermined phase difference for the phase of the output signal is generated and input into the timing comparator 14, the delay controlling unit 22 controls the variable delay circuit 18 with a delay amount obtained by adding the predetermined phase difference to the skew adjustment delay amount.

The first phase comparing unit 20 compares the phase of the strobe signal output from the variable delay circuit 18 and the phase of the output signal output from the device under test 200, and supplies a delay control voltage according to the phase difference to the PLL circuit 26. In this example, the first phase comparing unit 20 supplies the delay control voltage to reduce the phase difference to the PLL circuit 26. In other words, when the phase of the strobe signal advances ahead of the phase of the output signal, the first phase comparing unit 20 outputs a delay control voltage to delay the phase of the strobe signal generated from the PLL circuit 26 according to the phase difference. Moreover, when the phase of the strobe signal delays behind the phase of the output signal, the first phase comparing unit 20 outputs a delay control voltage to advance the phase of the strobe signal generated from the PLL circuit 26 according to the phase difference.

In other words, when a delay amount in the variable delay circuit 18 is increased by a and the phase of the strobe signal input into the first phase comparing unit 20 is delayed α, the phase of the strobe signal output from the PLL circuit 26 advances by α. By such a configuration, it is possible to generate a strobe signal having a desired phase difference for an output signal in synchronization with the output signal.

Figure 2:
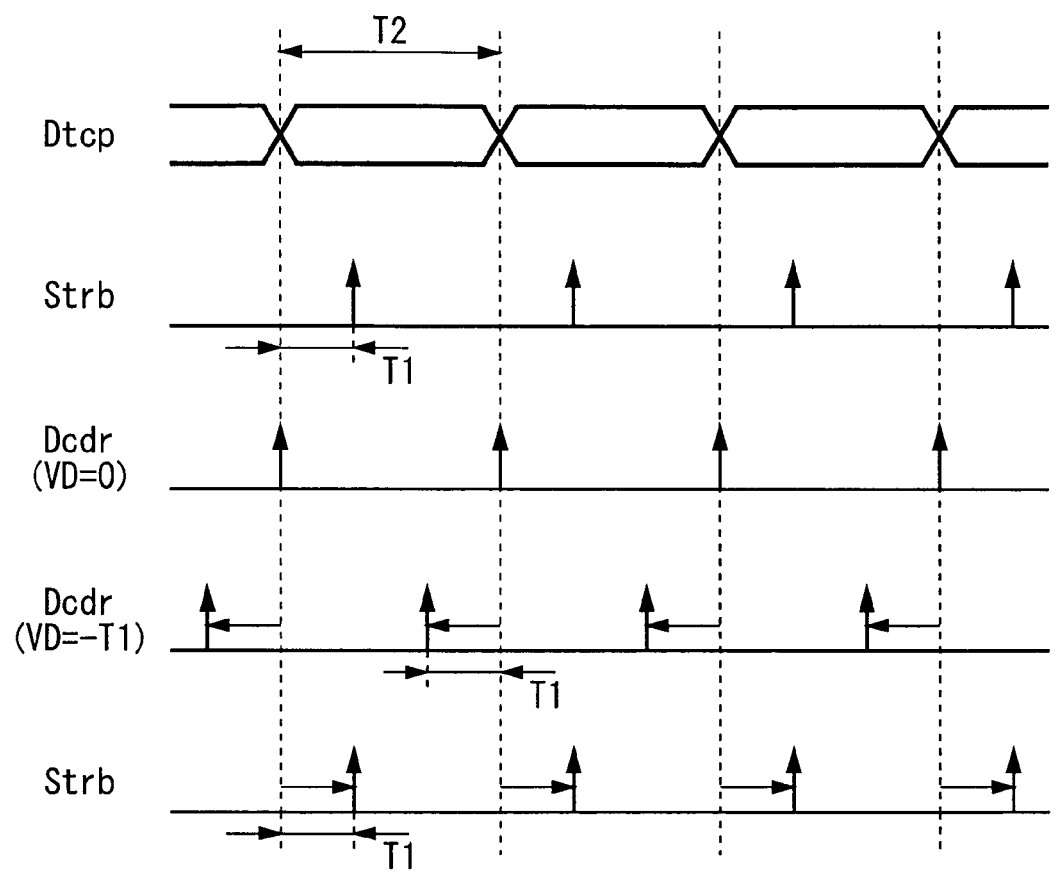
FIG. 2 is a timing chart exemplary showing an operation of a timing generator described in FIG. 1.

FIG. 2 is a timing chart exemplary showing an operation of the timing generator 40 described in FIG. 1. In this example, it will be described about an operation of the timing generator 40 when a strobe signal having the delayed phase by T1 for an output signal from the device under test 200 is input into the timing comparator 14.

Moreover, in this example, a delay amount in the variable delay circuit 18 will be described using a skew adjustment delay amount as a standard. In other words, when a delay amount in the variable delay circuit 18 is equal to a skew adjustment delay amount, a delay amount in the variable delay circuit 18 is described as zero.

When a delay amount VD in the variable delay circuit 18 is zero (VD=0), the first phase comparing unit 20 controls the PLL circuit 26 so that a phase difference between a strobe signal Dcdr input into the first phase comparing unit 20 and an output signal Dtcp input into the timing comparator 14 becomes zero. Then, when a delay amount −T1 according to a shift amount of the phase of the strobe signal to be input into the timing comparator 14 is set in the variable delay circuit 18 (VD=−T1), the first phase comparing unit 20 detects the phase difference between the input strobe signal Dcdr and the output signal Dtcp.

The first phase comparing unit 20 generates a delay control voltage to remove the detected phase difference, and inputs it to the PLL circuit 26. For this reason, a strobe signal Strb output from the PLL circuit 26 has a phase delayed by T1 with respect to the output signal Dtcp. In this case, a phase of the strobe signal Dcdr input into the first phase comparing unit 20 is generally equal to a phase of the output signal Dtcp, because a phase shift amount in the PLL circuit 26 and a phase shift amount in the variable delay circuit 18 are offset each other. Therefore, the first phase comparing unit 20 outputs a delay control voltage holding the phase of the strobe signal output from the PLL circuit 26. Thus, the phase of the strobe signal output from the PLL circuit 26 is shifted by T1 and is held in the shifted state.

By such a control, it is possible to generate a strobe signal having a desired phase difference for an output signal in synchronization with the output signal. Moreover, when generating a strobe signal in which a phase difference for an output signal is large than a data period T2 of the output signal, it is preferable that the variable delay circuit 18 changes a delay amount delaying the strobe signal with a change amount smaller than the data period T2 of the output signal in incremental steps. For example, when changing the delay amount in the variable delay circuit 18 from zero to a delay amount T3 larger than T2 at a time, the phase of the strobe signal input into the first phase comparing unit 20 is shifted by T3.

However, since the first phase comparing unit 20 detects a phase difference between adjacent edges of the output signal being input and the strobe signal, the first phase comparing unit 20 cannot detect the phase difference T3 larger than the data period T2. In this case, the first phase comparing unit 20 detects a phase difference T4 obtained by removed a component of integral multiple of the data period T2 from the phase difference T3. For this reason, the phase of the strobe signal output from the PLL circuit 26 is shifted by T4.

On the contrary, the delay controlling unit 22 in this example divides the phase difference T3 into a change amount smaller than the data period T2, and changes a delay amount in the variable delay circuit 18 every the divided change amount in incremental steps. At this time, whenever the delay controlling unit 22 changes the delay amount in the variable delay circuit 18, it is preferable that the delay controlling unit 22 sets the next delay amount after the phase of the strobe signal output from the PLL circuit 26 is stable. By such a control, the phase difference of the output signal and the strobe signal input into the first phase comparing unit 20 is divided by a value smaller than the data period T2 to be detected, and thus the phase difference T3 larger than the data period T2 can be generated.

Figure 3:
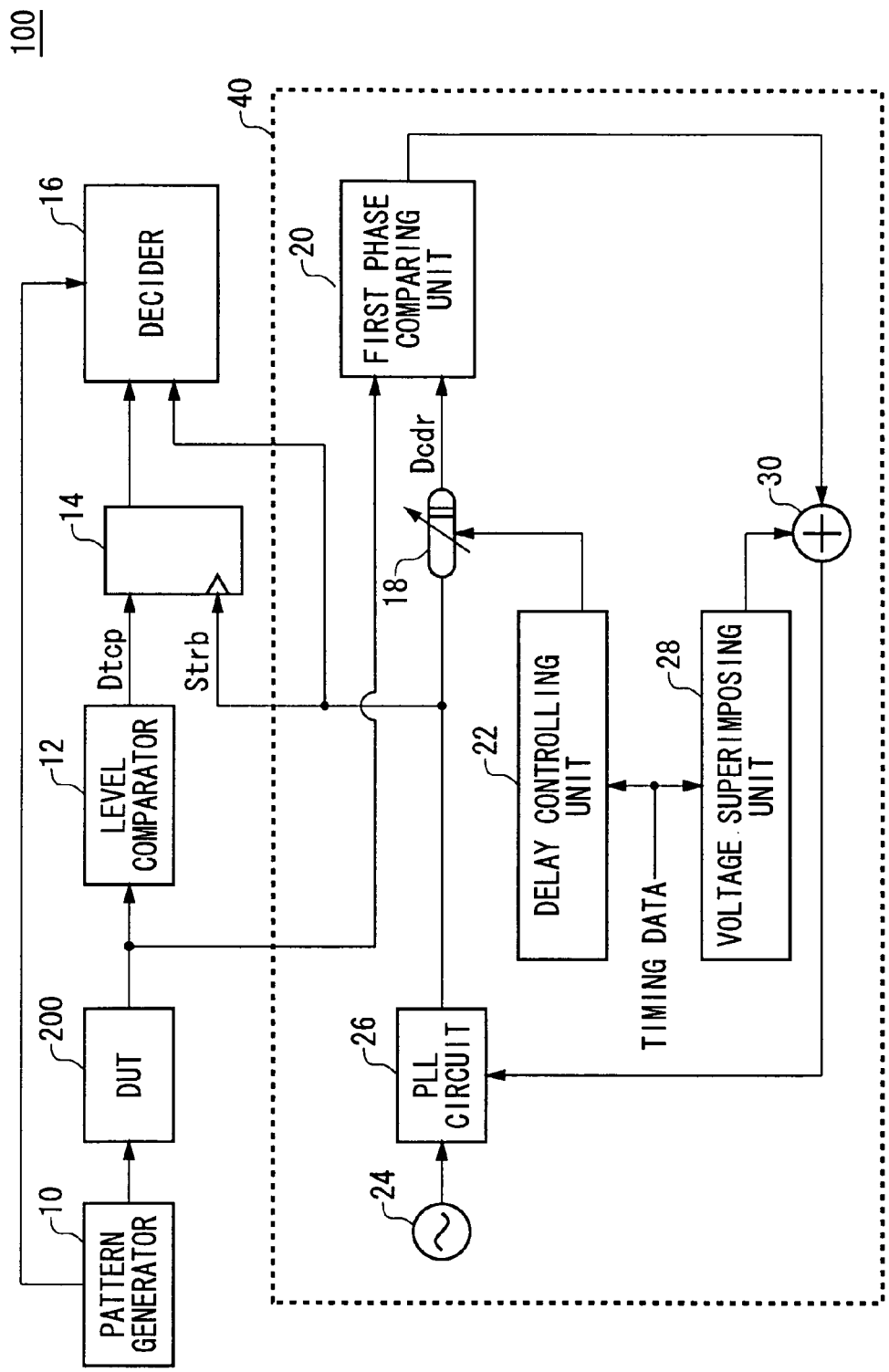
FIG. 3 is a view showing another example of a configuration of the test apparatus.

FIG. 3 is a view showing another example of a configuration of the test apparatus 100. The test apparatus 100 in this example has a timing generator 40 having a configuration different from that of the timing generator 40 in the test apparatus 100 shown in FIG. 1. The timing generator 40 in this example further has a voltage superimposing unit 28 and an addition unit 30 in addition to a configuration of the timing generator 40 shown in FIG. 1.

The voltage superimposing unit 28 generates a phase difference voltage according to a predetermined phase difference of the strobe signal input into the timing comparator 14 to the output signal. The relation between the phase difference and the phase difference voltage is the generally same as the relation between the phase difference and the delay control voltage detected by the first phase comparing unit 20. The relation between the phase difference and the phase difference voltage may previously be supplied to the voltage superimposing unit 28. The voltage superimposing unit 28 generates the phase difference voltage based on the given timing data and the relation between the phase difference and the phase difference voltage. Moreover, the addition unit 30 superimposes the phase difference voltage generated from the voltage superimposing unit 28 on the delay control voltage output from the first phase comparing unit 20, and sends it to the PLL circuit 26.

Moreover, the delay controlling unit 22 in this example sets a delay amount of the variable delay circuit 18 according to the given timing data, similarly to the delay controlling unit 22 described in FIG. 1. In other words, the variable delay circuit 18 delays the strobe signal so as to remove the delay caused by the phase difference generated from the voltage superimposing unit 28 and the strobe signal output from the PLL circuit 26.

That is, the timing generator 40 in FIG. 1 controls a delay amount of the variable delay circuit 18 to cause the first phase comparing unit 20 to detect a phase difference according to the delay amount. In this way, the phase of the strobe signal output from the PLL circuit 26 is controlled. On the contrary, the timing generator 40 in this example controls the phase of the strobe signal output from the PLL circuit 26 by directly controlling the delay control voltage being input into the PLL circuit 26. However, when controlling the phase of the strobe signal output from the PLL circuit 26, the phase difference is detected by the first phase comparing unit 20, the PLL circuit 26 is controlled so as to remove the phase difference. For this reason, the timing generator 40 in this example prevents the PLL circuit 26 from being controlled so that the first phase comparing unit 20 removes the phase difference, by removing the phase shift in the variable delay circuit 18. For this reason, it is possible to generate a strobe signal having a desired phase difference for an output signal in synchronization with the output signal.

Figure 4:
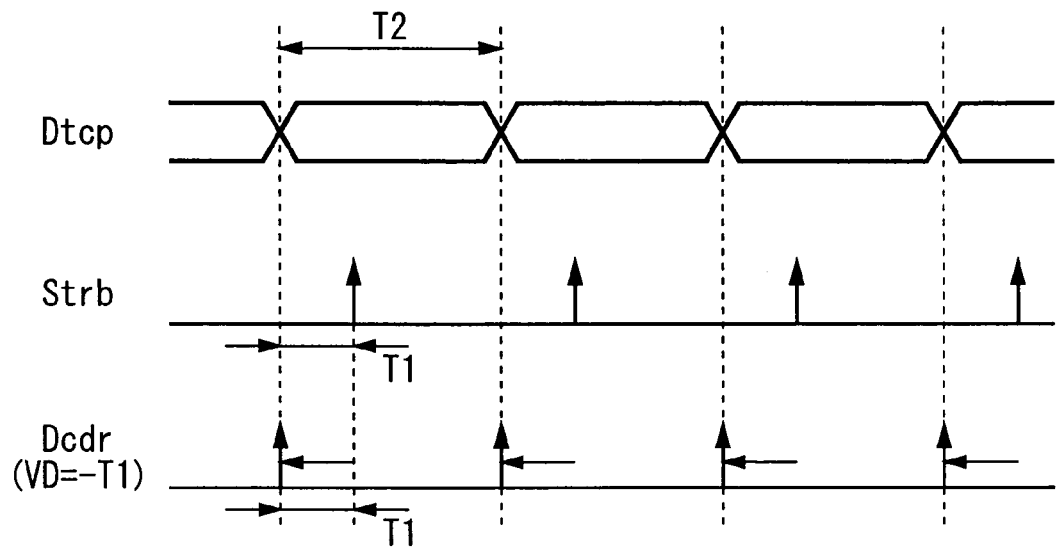
FIG. 4 is a view exemplary showing an operation of the timing generator described in FIG. 3.

FIG. 4 is a view exemplary showing an operation of the timing generator 40 described in FIG. 3. In this example, an operation of the timing generator 40 will be described when inputting a strobe signal having a phase delayed by T1 for an output signal from the device under test 200 into the timing comparator 14.

Moreover, in this example, a delay amount in the variable delay circuit 18 will be described using a skew adjustment delay amount as a standard. That is, when a delay amount in the variable delay circuit 18 is equal to a skew adjustment delay amount, the delay amount in the variable delay circuit 18 is described as zero.

As described above, the voltage superimposing unit 28 generates a phase difference voltage according to the predetermined phase difference T1 of a strobe signal input into the timing comparator 14 to an output signal, and shifts the phase of the strobe signal output from the PLL circuit 26 by T1. In this way, the strobe signal input into the timing comparator 14 has the phase difference T1 for the output signal.

Then, the delay controlling unit 22 sets a delay amount (VD=−T1) removing the phase difference with respect to the variable delay circuit 18. In this way, the phase difference between the strobe signal and the output signal input into the first phase comparing unit 20 becomes generally zero. For this reason, it is possible to generate a strobe signal having a desired phase difference for an output signal in synchronization with the output signal.

Moreover, in the timing generator 40 in this example, it is possible to easily generate a strobe signal in which the phase difference T1 for an output signal is larger than the data period T2 of the output signal. Even in this case, the voltage superimposing unit 28 generates a phase difference voltage according to the phase difference T1, and superimposes it on a delay control voltage. In this way, the phase of the strobe signal output from the PLL circuit 26 is shifted by T1. Moreover, since the phase shift is cancelled by the variable delay circuit 18, the phase difference between the strobe signal and the output signal input into the first phase comparing unit 20 is smaller than the data period T2 of the output signal. Therefore, although the phase difference is larger than the data period T2, the timing generator 40 in this example can easily generate a strobe signal having the phase difference without shifting the phase of the strobe signal in incremental steps.

Figure 5:
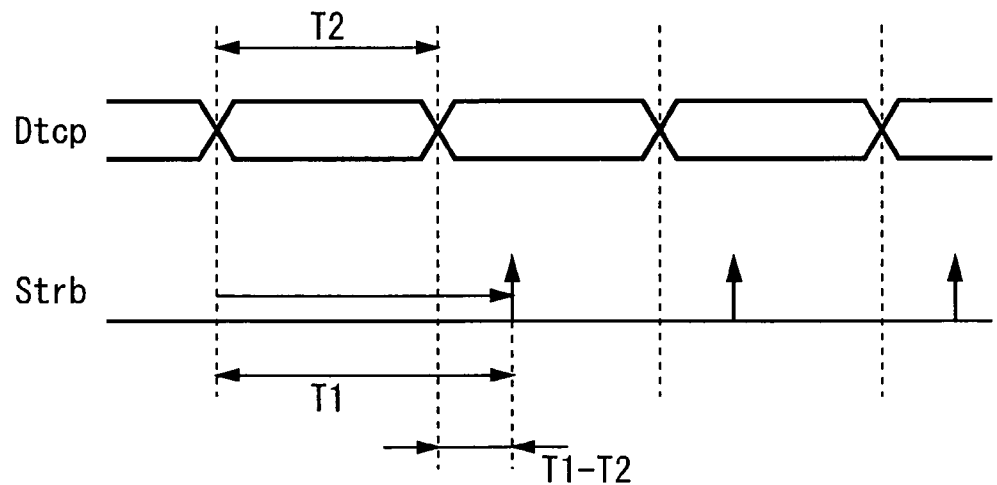
FIG. 5 is a view showing another example of an operation when the timing generator described in FIG. 3 generates a strobe signal in which a phase difference T1 for an output signal is larger than a data period T2 of the output signal.

FIG. 5 is a view showing another example of an operation when the timing generator 40 described in FIG. 3 generates a strobe signal in which a phase difference T1 for an output signal is larger than a data period T2 of the output signal. In this example, the voltage superimposing unit 28 generates a phase difference voltage according to a component (in this example, T2) of integral multiple of the data period T2 within the phase difference T1.

Moreover, the delay controlling unit 22 controls a delay amount of the variable delay circuit 18 with a delay amount according to a component (in this example, T1–T2) obtained by subtracting the component of integral multiple of the data period T2 from the phase difference T1. That is, the first phase comparing unit 20 detects the phase difference obtained by subtracting the component of integral multiple of the data period T2 from the phase difference T1, and outputs a delay control voltage according to the phase difference. Then, the voltage superimposing unit 28 superimposes the phase difference voltage according to the component of integral multiple of the data period T2 within the phase difference T1 on the delay control voltage. Therefore, the delay control voltage input into the PLL circuit 26 becomes a voltage according to the phase difference T1, and the phase of the strobe signal output from the PLL circuit 26 is shifted by T1.

Then, since the phase difference between the strobe signal output from the variable delay circuit 18 and the output signal becomes integral multiple of the data period T2, the first phase comparing unit 20 outputs the delay control voltage holding the phase shift amount without detecting a phase difference. By such a control, it is also possible to easily generate a strobe signal in which the phase difference T1 for an output signal is larger than the data period T2 of the output signal.

Figure 6:
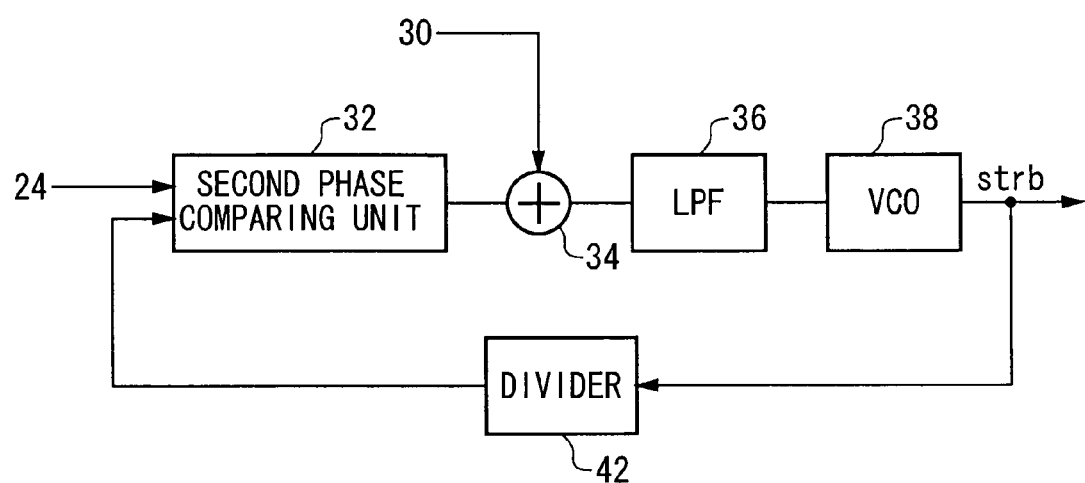
FIG. 6 is a view exemplary showing a configuration of a PLL circuit.

FIG. 6 is a view exemplary showing a configuration of the PLL circuit 26. The PLL circuit 26 in this example has a second phase comparing unit 32, an addition unit 34, a low-pass filter 36, a voltage-controlled oscillating unit 38, and a divider 42. The second phase comparing unit 32 is supplied with a reference clock, and receives a strobe signal generated from the voltage-controlled oscillating unit 38 via the divider 42. The second phase comparing unit 32 compares a phase of the reference clock and a phase of the strobe signal, and outputs a PLL control voltage according to the phase difference.

The addition unit 34 adds the delay control voltage to the PLL control voltage, and supplies the added voltage to the voltage-controlled oscillating unit 38. The voltage-controlled oscillating unit 38 generates a strobe signal with frequency according to the voltage given from the addition unit 34 via the low-pass filter 36. By such a configuration, it is possible to a strobe signal of which a phase is shifted according to a delay control voltage.

Figure 7:
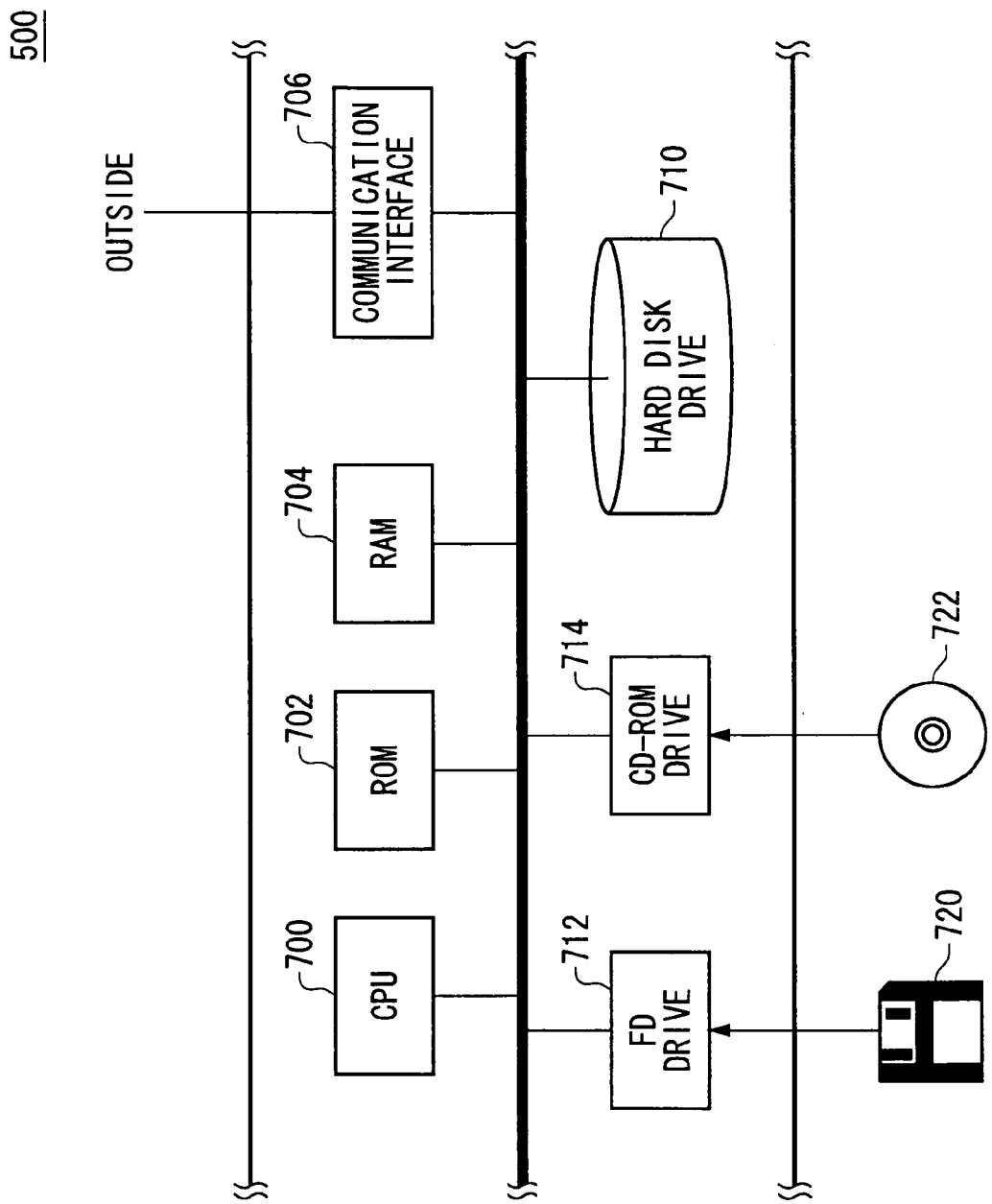
FIG. 7 is a view exemplary showing a configuration of a computer making the test apparatus function.

FIG. 7 is a view exemplary showing a configuration of a computer 500 that causes the test apparatus 100 to function. In this example, the computer 500 stores a program causing the test apparatus 100 to function as described in FIGS. 1 to 6. The computer 500 includes a CPU 700, a ROM 702, a RAM 704, a communication interface 706, a hard disk drive 710, a FD drive 712, and a CD-ROM drive 714. The CPU 700 operates based on a program stored on the ROM 702, the RAM 704, the hard disk drive 710, a flexible disk 720, and/or a CD-ROM 722.

For example, the program, which causes the test apparatus 100 to function, causes the test apparatus 100 to function as the pattern generator 10, the level comparator 12, the timing comparator 14, the decider 16, and the timing generator 40 described in FIGS. 1 to 6. The communication interface 706 communicates with, e.g., the test apparatus 100 to control the test apparatus 100.

The hard disk drive 710 as an example of a storage apparatus stores configuration information and a program to make the CPU 700 operate. The ROM 702, the RAM 704, and/or the hard disk drive 710 stores a program to cause the test apparatus 100 to function as the test apparatus 100 described in reference to FIGS. 1 to 6. Moreover, the program may be stored on the flexible disk 720, the CD-ROM 722, or the like.

The FD drive 712 reads a program from the flexible disk 720, and provides it to the CPU 700. The CD-ROM drive 714 reads a program from the CD-ROM 722, and provides it to the CPU 700.

Moreover, a program may directly be read from a recording medium to a RAM to be executed, or may be read to a RAM to be executed after being installed in a hard disk drive once. Further, the program may be stored on a single recording medium, or may be stored on a plurality of recording media. Moreover, a program stored on a recording medium may provide each function jointly with an operating system. For example, a program may request an operating system an execution of a part or the whole of a function, and provide the function based on a response from the operating system.

A recording medium storing a program can include an optical recording medium such as DVD and PD, a magneto-optical recording medium such as MD, a tape medium, a magnetic recording media, and a semiconductor memory such as an IC card and a miniature card, in addition to a flexible disk and a CD-ROM. Moreover, a recording medium may include a storage apparatus such as a hard disk or a RAM provided in a server system connected to a private communication network or Internet.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to generate a strobe signal having a desired phase difference for an output signal in synchronization with the output signal by means of a simple circuit.

What is claimed is:

1. A test apparatus testing a device under test, comprising:
a timing generator for generating, based on an output signal from the device under test, a strobe signal having a predetermined phase difference for the output signal;
   a timing comparator for detecting a signal value of the output signal at the timing of the strobe signal; and
   a decider for comparing the signal value detected by said timing comparator with a previously given expected value and deciding the good or bad of the device under test, wherein said timing generator comprises:
   a PLL circuit for generating the strobe signal of which the timing is shifted according to a given delay control voltage;
   a variable delay circuit for delaying the strobe signal according to the predetermined phase difference of the strobe signal for the output signal, the variable delay circuit being provided divergently from a path connecting the PLL circuit and said timing comparator; and
   a first phase comparing unit for comparing a phase of the strobe signal output from the variable delay circuit and a phase of the output signal output from the device under test and supplying the delay control voltage according to the phase difference to the PLL circuit.

2. The test apparatus as claimed in claim 1, further comprising a delay controlling unit for previously storing a skew adjustment delay amount of adjusting a skew between a delay amount on a path from the device under test to said timing comparator and a delay amount on a path from the device under test to the first phase comparing unit and controlling a delay amount in the variable delay circuit to be a delay amount obtained by adding and subtracting the predetermined phase difference to and from the skew adjustment delay amount.

3. The test apparatus as claimed in claim 2, wherein said delay controlling unit:
   controls the variable delay circuit to be the delay amount obtained by subtracting the predetermined phase difference from the skew adjustment delay amount when generating the strobe signal that is delayed from the phase of the output signal by the predetermined phase difference; and
   controls the variable delay circuit to be the delay amount obtained by adding the predetermined phase difference to the skew adjustment delay amount when generating the strobe signal that is advanced from the phase of the output signal by the predetermined phase difference.

4. The test apparatus as claimed in claim 1, wherein the variable delay circuit changes the delay amount delaying the strobe signal with a change amount smaller than a data period of the output signal in incremental steps when the phase difference for the output signal generates the strobe signal larger than the data period of the output signal.

5. The test apparatus as claimed in claim 1, wherein said timing generator further comprises:
   a voltage superimposing unit for superimposing a voltage according to a component of integral multiple of the data period in the phase difference on the delay control voltage supplied from the first phase comparing unit to the PLL circuit when the phase difference for the output signal generates the strobe signal larger than the data period of the output signal; and
   a delay controlling unit for controlling a delay amount of the variable delay circuit with a delay amount according to a component obtained by subtracting the component of integral multiple of the data period from the predetermined phase difference.

6. The test apparatus as claimed in claim 1, wherein
said timing generator further comprises a voltage superimposing unit for superimposing a phase difference voltage according to the predetermined phase difference on the delay control voltage, and
the variable delay circuit delays the strobe signal so as to cancel a delay caused by the phase difference voltage on the strobe signal.

7. The test apparatus as claimed in claim 6, wherein the PLL circuit comprises:

a second phase comparing unit for comparing a phase of a given reference clock and the phase of the strobe signal and outputting a PLL control voltage according to the phase difference;

a voltage-controlled oscillating unit for generating the strobe signal with frequency according to a given voltage; and an addition unit for adding the delay control voltage and the PLL control voltage to supply the added voltage to the voltage-controlled oscillating unit.

8. A timing generator that generates a strobe signal having a predetermined phase difference for an output signal from a device under test based on the output signal from the device under test, comprising:

a PLL circuit for generating the strobe signal of which the timing is shifted according to a given delay control voltage;

a variable delay circuit for delaying the strobe signal according to the predetermined phase difference of the strobe signal for the output signal; and a first phase comparing unit for comparing a phase of the strobe signal output from said variable delay circuit and a phase of the output signal output from the device under test and supplying the delay control voltage according to the phase difference to said PLL circuit.

9. A recordable medium storing a program making a test apparatus testing a device under test function, the program when executed making the test apparatus function as:

a timing generator for generating based on an output signal from the device under test, a strobe signal having a predetermined phase difference for the output signal;

a timing comparator for detecting a signal value of the output signal at the timing of a strobe signal; and a decider for comparing the signal value detected by said timing comparator with a previously given expected value and deciding the good or bad of the device under test, wherein the program making said timing generator function as:

a PLL circuit for generating the strobe signal of the strobe signal of which the timing is shifted according to a given delay control voltage;

a variable delay circuit for delaying the strobe signal according to the predetermined phase difference of the strobe signal for the output signal, the variable delay circuit being provided divergently from the path connecting the PLL circuit and said timing comparator; and a first phase comparing unit for comparing a phase of the strobe signal output from the variable delay circuit and a phase of the output signal output from the device under test and supplying the delay control voltage according to the phase difference to the PLL circuit.

* * * * *